United States Patent

McCann

[15] 3,654,527

[45] Apr. 4, 1972

[54] UNITARY FULL WAVE INVERTER

[72] Inventor: Joseph A. McCann, Auburn, N.Y.

[73] Assignee: General Electric Company

[22] Filed: July 27, 1970

[21] Appl. No.: 58,272

[52] U.S. Cl. .....................317/234 R, 317/234 A, 317/234 E, 317/234 G, 317/234 J, 307/321

[51] Int. Cl. ..........................................H01l 3/00, H01l 5/00

[58] Field of Search ....................317/234, 235, 1, 3, 3.1, 4.1, 317/5, 5.2, 5.4, 11; 307/303, 321

[56] References Cited

UNITED STATES PATENTS

| | | | |
|---|---|---|---|
| 3,307,077 | 2/1967 | Bernstein | 317/234 |
| 3,348,105 | 10/1967 | Doyle | 317/235 |
| 3,365,794 | 1/1968 | Botka | 317/235 |
| 3,462,655 | 8/1969 | Coblenz | 317/234 |
| 3,463,970 | 8/1969 | Gutzwiller | 317/234 |
| 3,476,985 | 11/1969 | Magner et al. | 317/234 |

*Primary Examiner*—John W. Huckert

*Assistant Examiner*—Andrew J. James

*Attorney*—Robert J. Mooney, Nathan J. Cornfeld, Carl O. Thomas, Frank L. Neuhauser, Oscar B. Waddell and Joseph B. Forman

[57] ABSTRACT

A semiconductor device is provided with four diodes integrated into a single monocrystalline semiconductive element. The semiconductive element is thermally coupled to a tab mounted heat sink through an electrically insulative substrate. A header is provided to relatively position the leads of the device. The heat sink may serve as one electrical connector.

9 Claims, 7 Drawing Figures

FIG.3.

Patented April 4, 1972 3,654,527

2 Sheets-Sheet 1

INVENTOR:
JOSEPH A. McCANN,

BY Carl O. Thomas
HIS ATTORNEY.

Patented April 4, 1972

3,654,527

2 Sheets-Sheet 2

INVENTOR:
JOSEPH A. McCANN,

BY Carl O. Thomas

HIS ATTORNEY.

UNITARY FULL WAVE INVERTER

My invention relates to a semiconductor device capable of performing the electrical functions of a full wave inverter bridge.

To convert an alternating current to a direct current four or more semiconductor rectifiers may be utilized. It has heretofore been recognized that utilizing four or more separate devices to perform the inverter function is wasteful of material, space, and assembly time. Approaches for integrating the circuit functions of four separate rectifiers into a single electrically active element or module are disclosed by Coblenz U.S. Pat. No. 3,462,655, Shwartzman U.S. Pat. No. 3,383,760, and in my copending application Ser. No. 58,271, filed on even date herewith titled Integrated Semiconductor Rectifiers And Processes For Their Fabrication. While the active modules disclosed may be mounted in an electrical circuit without the exercise of invention, the modules are not packaged so that they may be mounted and lead attached in the same manner as conventional discrete semiconductor devices.

It is an object of my invention to provide an electrical converter that is unitarily packaged in a manner to facilitate ready mounting and circuit interconnection.

This and other objects of my invention are accomplished in one aspect by providing a semiconductor device comprised of an electrically conductive heat sink having a laterally extending mounting tab portion. Means are provided for an electrically insulative surface and a thermally conductive path from the surface to the heat sink. First and second laterally spaced electrically conductive output contact means are provided as well as third and fourth laterally spaced electrically conductive input contact means. Each of the third and fourth contact means has a portion overlying both of the first and second contact means and spaced therefrom. Semiconductor bridge means provide unidirectional current paths between the first contact means and the third and fourth contact means. The semiconductor bridge means also provides oppositely directed unidirectional current paths between the second contact means and the third and fourth contact means. One of the input and the output contact means is interposed between and provides a thermally conductive path between the semiconductor bridge means and the electrically insulative surface. A protective passivant means is associated with the semiconductor bridge means and cooperates with the contact means for encapsulation of the semiconductor bridge means.

My invention may be better understood by reference to the following detailed description considered in conjunction with the drawings, in which FIG. 1 is a plan view, with casement portions removed, of a semiconductor device according to my invention;

Figure 1:
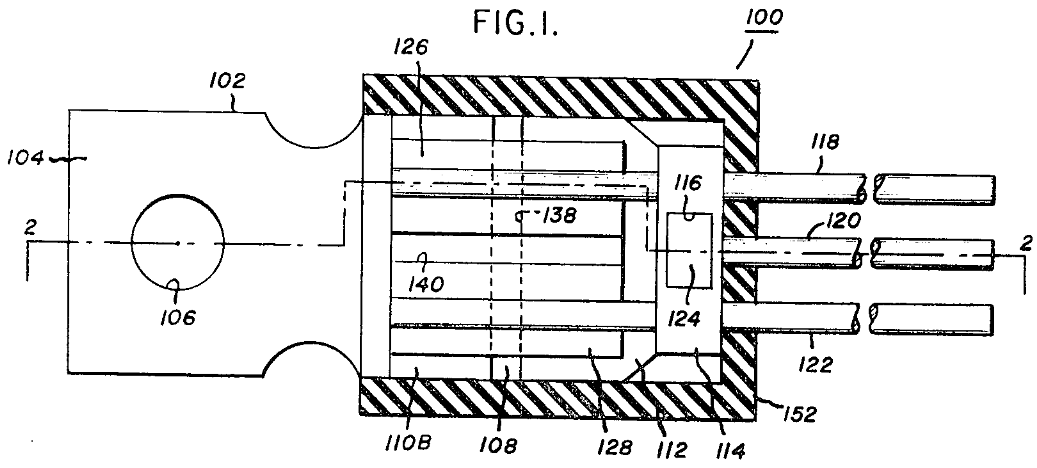
Figure 2:
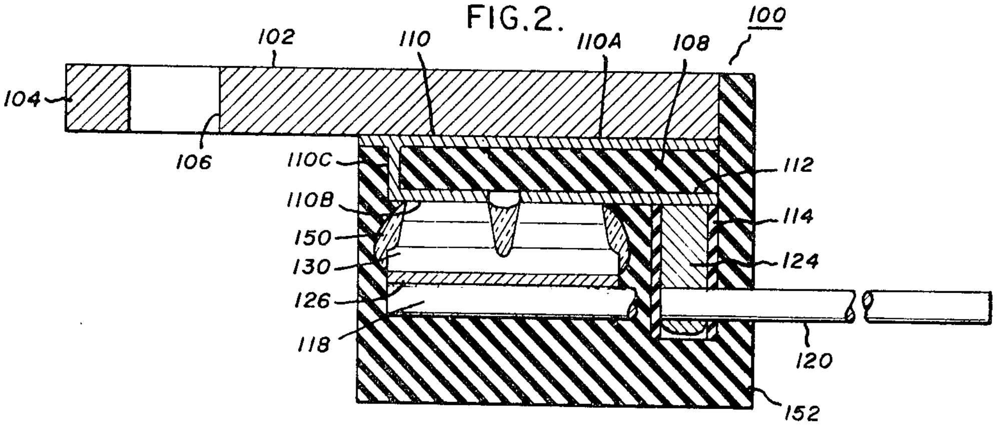
FIG. 2 is a sectional view taken along section line 2—2 in FIG. 1.

Noting FIGS. 1 and 2, a semiconductor device 100 is shown having an electrically and thermally conductive heat sink 102 possessing an integral laterally extending tab portion 104 with an aperture 106 therein for mounting the device to a heat receiving chassis or heat exchanger. A thermally conductive, electrically insulative substrate 108 formed of a material such as beryllia, alumina, aluminum nitride, etc., overlies the heat sink and is bonded to the heat sink to provide a low impedance thermal coupling therebetween by a first contact 110. The contact 110 includes a portion 110A which underlies the substrate and functions principally as a bonding material and as a means for providing a low impedance thermal path from the substrate to the heat sink. The contact 110 includes a portion 110B which is associated with a surface of the substrate remote from the heat sink and serves as an electrical conductor, a bonding material, and a thermal conductor. The contact 110 further includes a portion 110C which provides an electrically conductive path between the portion 110B and the heat sink. It is appreciated that the portion 110A of the contact may in many instances be most conveniently formed separate from the portions 110B and 110C.

A second contact 112 is laterally spaced from the first contact portion 110B and is similarly thermally associated with the surface of the substrate remote from the heat sink. An insulative header 114 is provided with a recess such as aperture 116 which overlies the second contact. The header relatively positions three leads 118, 120, and 122. The central lead 120 extends into the aperture 116 while the remaining leads are laterally spaced from the aperture. A solder body 124 is located within the aperture 116 and is integrally bonded to the second contact to form an electrically conductive path between the second contact and the central lead. A third contact 126 is conductively bonded to the lead 118 while a fourth contact 128 is conductively bonded to the lead 122. Both of the third and fourth contacts overlie portions of both of the first and second contacts and are spaced therefrom.

Unidirectional current paths between each of the third and fourth contacts, hereinafter also referred to as input contacts, and each of the first and second contacts, hereinafter also referred to as output contacts, are provided. The unidirectional current paths between the input contacts and the first contact are like directed while the unidirectional current paths between the input contacts and the second contact are like directed, but oppositely directed to the current paths associated with the first contact. In a preferred form of my invention a monocrystalline semiconductive element 130 is incorporated to provide these four separate current paths.

Figure 3:
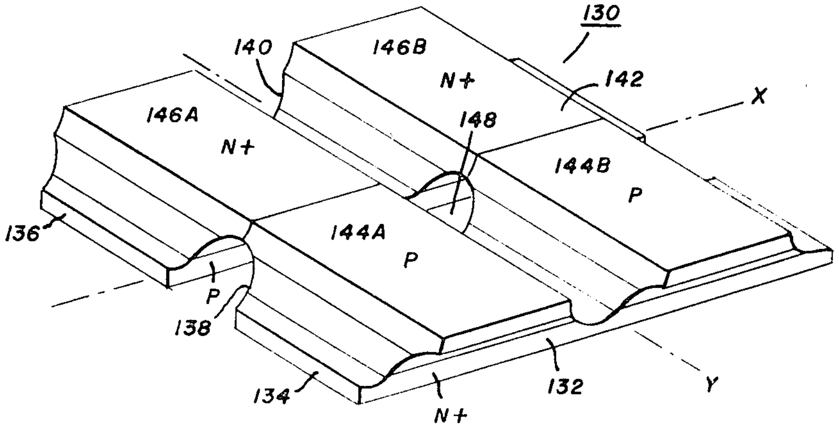
FIG. 3 is an isometric view of an integrated semiconductive bridge element.
Figure 4:
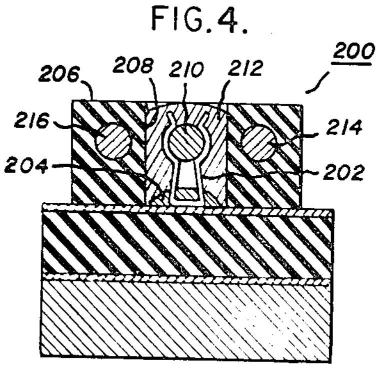
FIG. 4 is a sectional view of a modified semiconductor device containing a lead and header fastener.

As is best appreciated by reference to FIG. 3, the monocrystalline semiconductive element 130 is comprised of a first zone 132 which lies adjacent a first major surface 134 and is laterally separated from a second zone 136 by a groove 138, which opens toward this major surface. The first zone is shown as N+ conductivity type while the second zone is shown as P conductivity type. A third zone of P conductivity type is divided by a groove 140 opening toward a second major surface 142 into a first segment 144A and a second, laterally spaced segment 144B. A fourth zone of N+ conductivity type is divided by the groove 140 into a first segment 146A and a second segment 146B. The grooves 138 and 140 intersect to form an aperture 148 centrally within the element. Since the first zone and the third zone segments which overlie it are of opposite conductivity types, rectifying junctions are formed between each of the third zone segments and the first zone. Similarly, rectifying junctions are formed between each of the fourth zone segments and the underlying second zone.

Referring to FIGS. 1 and 2, it can be seen that the first zone of the semiconductive element is associated with the first contact. The first contact provides both an electrically and thermally conductive coupling to the semiconductive element and physically bonds the element to the substrate. The second contact is similarly bonded to the second zone. The first segments of the third and fourth zones are electrically conductively bonded to the lead 118 through the third contact while the second segments of the third and fourth zones are electrically conductively bonded to the lead 122 through the fourth contact. A protective passivant 150 is associated with the semiconductive element within the grooves and around the periphery of the element. The protective passivant as a minimum covers the edge intersections of the rectifying junctions with the surface of the element and preferably cooperates with the contacts to encapsulate the semiconductive element. The protective passivant is in a preferred form glass, but may be any conventional passivant, such as an oxide, a nitride, a silicone varnish or resin, epoxy resin, etc. Where glass is utilized to form the passivant, no other packaging of the semiconductive element may be required. In the form shown a molded casement 152 surrounds the header, semiconductive element, and substrate. As is well understood in the art the casement my be formed of resins, such as silicone, phenolic, and epoxy resins.

In use, the semiconductor device 100 may be mounted to a chassis or heat exchanger by soldering the heat sink 102 thereto or merely by bolting the tab portion 104 through the aperture 106 to the chassis or heat exchanger. An alternating current source may be connected to the leads 118 and 122. A direct current receiving load may be attached to the lead 120 and to the heat receiving member or directly to the tab portion of the device. During a half cycle in which the lead 118 lies at a positive potential with respect to the lead 122, current flows from the lead 118 to the heat sink through the third contact 126 and the first segment 144A of the third zone to the first zone 132 and the first contact portion 110B. Current is conducted by the portion 110C to the heat sink. Current received from the load through lead 120 passes through the second contact 112, the second zone 136, and the second segment 146B of the fourth zone to the lead 122. When the lead 118 is negatively biased with respect to the lead 122, current flows from the lead 122 through the second segment 144B of the third zone and from the lead 120 to the lead 118 through the first segment 146A of the fourth zone. Where appreciable current levels are being carried a significant amount of heat will be generated within the semiconductive element that cannot be readily dissipated through the leads. The first and second contacts prevent overheating by providing a thermally conductive path to the substrate 108. The substrate in turn transmits the heat to the heat sink through the portion 110A of the first contact. It is to be noted that a significant fraction of the heat generated by the semiconductive element may shunt the substrate through the portion 110C of the first contact. It is to be noted that the device 100 can be mounted in position for use with only a fraction of the effort and space required to mount four or more separate rectifiers. Further, the leads may be readily bent to meet circuit interconnection requirements without fear of transmitting stresses to the semiconductive element, since the header holds the inner portions of the leads in fixed spatial relation.

In assembling the semiconductor device 100 the substrate with the first and second contacts attached may be conveniently bonded to the heat sink. Thereafter the semiconductive element with the protective passivant and third and fourth contacts attached may be located over the first and second contacts and bonded thereto. Thereafter the header and leads as a sub-unit may be located over the second contact with the inner portions of the leads 118 and 122 extending over the third and fourth contacts, respectively. The leads can be soldered to the third and fourth contacts while the lead 120 is soldered to the second contact by placing solder in the recess 116. Soldering of the leads to the second, third, and fourth contacts can be performed sequentially or simultaneously.

In the semiconductor device 100 it is necessary that some means external of the device be provided to hold the lead and header sub-unit in position prior to soldering the leads to the contacts. In the semiconductor device 200 a resilient fastener 202 is bonded to the second contact by solder 204. Thus, in order to mount the header-lead sub-unit 206, which may be identical to that of device 100, into position for soldering, it is merely necessary to fit the fastener into the recess 208 so that it engages central lead 210. Thereafter a solder body 212 may be located within the aperture to provide a better electrical connection between the second contact and the central lead. Until the solder 212 is provided, however, the fastener holds the leads 214 and 216 in the desired position for bonding to the third and fourth contacts. Except as specifically noted above the elements of the semiconductor device 200 may be identical to those of semiconductor device 100 and accordingly they are not redescribed.

Figure 5:
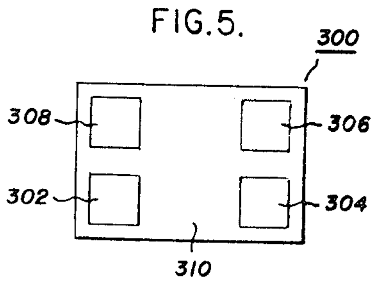
FIG. 5 is a plan view of a module formed of multiple semiconductive elements.

Referring to FIG. 3 it can be seen that the semiconductive element 130 can be resolved into four integrated rectifier subunits which are joined along the X and Y axis located in the groove troughs. Instead of utilizing the semiconductive element as a single element as shown it is appreciated that the semiconductive element could be subdivided along the Y axis to yield two identical halves that could be separately located in the semiconductor device 100. For three phase current rectification the semiconductive element could be provided with a third portion identical to the two portions separated by the Y axis. The third portion could be integrated with or separate from the element shown in FIG. 3. In order to accommodate three phase rectification it would, of course, be necessary to add a third input lead to the semiconductor device. Instead of utilizing an integrated semiconductive element as shown in FIG. 3 this element could be sub-divided along both the X and Y axes to form four separate rectifier elements. This would, however, be disadvantageous to most applications, since four elements would be much more tedious to assemble into a device than one. As shown in FIG. 5 a module 300 is provided comprised of four discrete semiconductive diode elements 302, 304, 306, and 308. These elements may be joined by a dielectric passivant body 310 to form a unitary module that can be readily substituted for the semiconductive element 130 and the protective passivant body associated therewith. Such a module is more fully described in the above noted Shwartzman patent.

Figure 6:
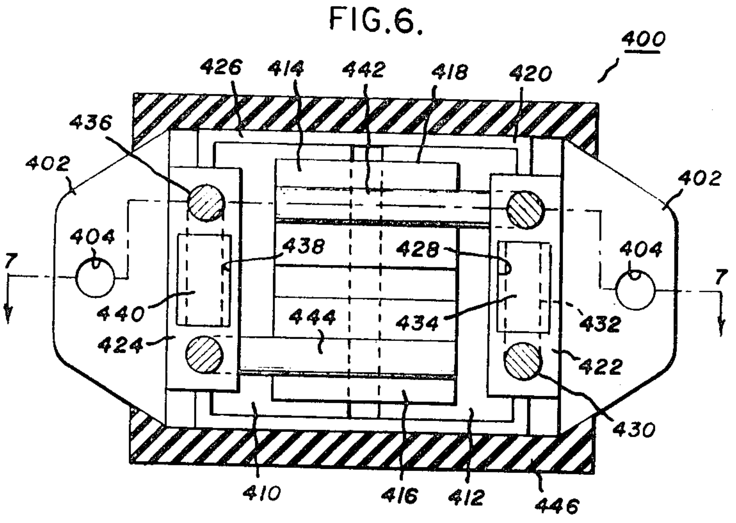
FIG. 6 is a plan view, with casement portions removed, of a modified semiconductor device.
Figure 7:
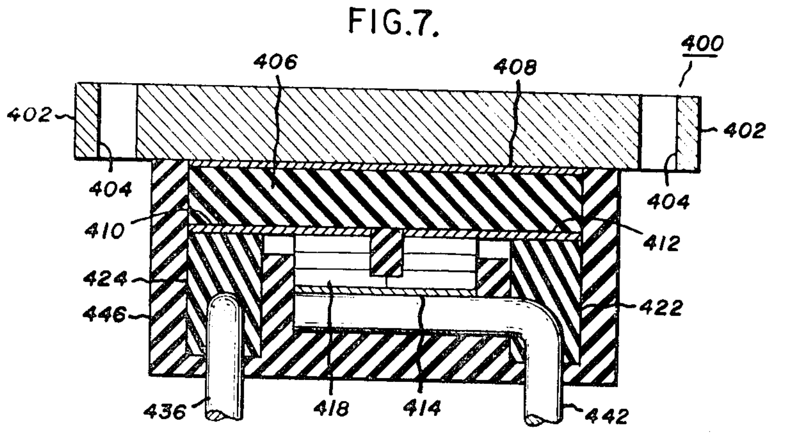
FIG. 7 is a sectional view taken along section line 7—7 in FIG. 6.

In the semiconductor device 100 it is to be noted that the heat sink serves as one device terminal. For many applications it is desired that the heat sink be electrically isolated from the device terminals. In FIGS. 6 and 7 the application of my invention to such a device configuration is illustrated. The device 400 is provided with an electrically isolated heat sink that is thermally conductive. The heat sink is provided with two identical laterally extending tab portions 402 each having an aperture 404 therein for mounting of the device to a chassis or heat exchanger. A thermally conductive, electrically insulative substrate 406 is shown coupled in thermally conductive relation to the heat sink by a solder layer 408. In an alternate form the substrate could be bonded directly to the surface of the heat sink as a thin layer. For example, thin layers of resins known to be good electrical insulators, such as Teflon, Mylar, epoxies, etc., could be used to form the substrate. First and second contacts 410 and 412 are located in laterally spaced relation and overlie the substrate. Third and fourth contacts 414 and 416 each overlie a portion of the first and second contacts and are spaced therefrom. A semiconductive element 418 is interposed between the contacts and related thereto similarly as the semiconductive element 130 in device 100. The semiconductive element 418 may be identical to the semiconductive element 130.

A header-lead sub-unit 420 surrounds the semiconductive element 418 and overlies the first and second contacts. This sub-unit includes a first header portion 422, a second header portion 424, and two connector portions 426 which relatively position the first and second header portions. The first header portion includes a recess 428. A first lead 430 is mounted by the first header portion with a leg portion 432 extending into the aperture. A body of solder 434 is located in the aperture to electrically interconnect the leg portion of the first lead to the underlying portion of the first contact. In an identical manner a second lead 436 is mounted by the second header portion and extends into a recess 438 therein. A solder body 440 interconnects the second lead with the underlying portion of the second contact. A third lead 442 is mounted by the first header portion so that it is electrically interconnected with the third contact while a fourth lead 444 overlies the fourth contact and is electrically interconnected thereto. A molded plastic casement 446 surrounds the substrate and the header portions.

In use, the heat sink is soldered or bolted to a chassis or heat exchanger. The first and second leads serve as direct current output leads while the third and fourth leads serve as alternating current input leads. Both the electrical input and the electrical output is isolated from the heat sink. However, the heat generated by current flow within the semiconductive element is readily transmitted through the substrate to the heat sink. The header portions allow the leads to be easily and accurately positioned during device assembly and prevent stresses applied to the leads during device interconnection into a circuit from being transmitted to the semiconductive element. While the header portions are shown bounding the recesses on four sides, it is appreciated that the recesses may be bounded on only three sides by these portions in any one of the devices 100, 200, or 400. It is appreciated that the plastic casement shown is only one of a variety of conventional techniques for packaging the semiconductive element that may be employed.

While I have disclosed my invention with reference to certain preferred embodiments it is appreciated that numerous variations will readily occur to those skilled in the art. It is accordingly intended that the scope of my invention be determined by reference to the following claims.

I claim:

1. A semiconductor device comprising an electrically conductive heat sink having a laterally extending mounting tab portion, means for providing on said heat sink an electrically insulative surface thermally conductively connected to said heat sink, first and second laterally spaced electrically conductive output contact means on said electrically insulative surface, an electrically insulative supporting header secured to said heat sink, third and fourth laterally spaced electrically conductive input contact means connected to said header, each having a portion overlying both of said first and second contact means and spaced therefrom, semiconductor bridge means having first and second opposed major surfaces sandwiched between and electrically connected to said first and second and said third and fourth contact means for providing unidirectional current paths between said first contact means and said third and fourth contact means and for providing oppositely directed unidirectional current paths between said second contact means and said third and fourth contact means, one of said input contact means and one of said output contact means being interposed between and providing a thermally conductive path between said semiconductor bridge means and said electrically insulative surface, and protective passivant means covering said semiconductor bridge means and cooperating with said contact means for encapsulation of said semiconductor bridge means.

2. A semiconductor device according to claim 1 in which said semiconductor bridge means is formed by a monocrystalline semiconductive element.

3. A semiconductor device according to Claim 1 in which one of said contact means is electrically conductively connected to said heat sink.

4. A semiconductor device according to Claim 1 additionally including as a portion of said protective passivant a molded casement surrounding said semiconductor bridge means.

5. A semiconductor device according to claim 1 in which said semiconductor bridge is formed of a plurality of discrete semiconductive elements and said protective passivant means is integrally united with said semiconductive elements.

6. A semiconductor device according to claim 1 wherein said semiconductor bridge means includes a monocrystalline semiconductive element having a first groove opening toward said first major surface and having a second groove opening toward said second major surface and intersecting the first groove, said element being comprised of a first zone of a first conductivity type associated with said first contact means located adjacent said first major surface and bounded on one edge by the first groove, a second zone of a second conductivity type associated with said second contact means located adjacent said first major surface and separated from said first zone by the first groove, a third zone of said second conductivity type overlying said first zone and forming a rectifying junction therewith, said third zone being divided by the second groove into two segments, each of said third zone segments being associated with a separate one of said input contact means, and a fourth zone of said first conductivity type overlying said second zone and forming a rectifying junction therewith, said fourth zone being divided by the second groove into two segments, each of said fourth zone segments being associated with a separate one of said input contact means.

7. A semiconductor device according to claim 1 wherein said insulative header has a recess therein for retaining solder forming a connection between one of said contact means and an external lead carried by said header and projecting beyond said encapsulation.

8. A semiconductor device according to claim 1 additionally including a second insulative header secured to said heat sink, and external leads carried by said second header connected to said first and second contacts and projecting from said encapsulation.

9. A semiconductor device comprising an electrically conductive heat sink having a laterally extending mounting tab portion, means for providing on said heat sink an electrically insulative surface thermally conductively connected to said heat sink, first and second laterally spaced electrically conductive contact means on said insulative surface, an insulative header having a recess therein secured to said heat sink and overlying said first contact means, first, second, and third leads carried by said header in spaced relation, said third lead extending into the recess of said header and said first and second leads being laterally spaced therefrom, means electrically conductively joining said third lead to said first contact means through the aperture in said header, means electrically conductively joining said second contact means to said heat sink, a monocrystalline semiconductive element having first and second opposed major surfaces, having a first groove opening toward said first major surface, and having a second groove opening toward said second major surface and intersecting the first groove comprised of a first zone of a first conductivity type associated with said first contact means located adjacent said first major surface and bounded on one edge by the first groove, a second zone of a second conductivity type associated with said second contact means located adjacent said first major surface and separated from said first zone by the first groove, a third zone of said second conductivity type overlying said first zone and forming a rectifying junction therewith, said third zone being divided by the second groove into two segments, each of said third zone segments being connected to a separate one of said first and second leads, a fourth zone of said first conductivity type overlying said second zone and forming a rectifying junction therewith, said fourth zone being divided by the second groove into two segments, each of said fourth zone segments being connected to a separate one of said first and second leads, said contact means connecting said semiconductor bridge means in thermally conductive relation to said insulative surface, and protective passivant means covering said semiconductor bridge means and cooperating with said contact means for encapsulation of said semiconductor bridge means.

* * * * *